United States Patent
Jung et al.

(10) Patent No.: US 7,122,428 B2
(45) Date of Patent: Oct. 17, 2006

(54) DEVICE ISOLATION METHOD OF SEMICONDUCTOR MEMORY DEVICE AND FLASH MEMORY DEVICE FABRICATING METHOD USING THE SAME

(75) Inventors: Sung Mun Jung, Kyunggido (KR); Jum Soo Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/019,352

(22) Filed: Dec. 23, 2004

(65) Prior Publication Data

US 2005/0142796 A1   Jun. 30, 2005

(30) Foreign Application Priority Data

Dec. 27, 2003   (KR)   .................. P10-2003-0098359

(51) Int. Cl.
*H01L 21/8247* (2006.01)
(52) U.S. Cl. ...................... 438/257; 438/296
(58) Field of Classification Search ........ 438/257–267, 438/296
See application file for complete search history.

(56) References Cited

U.S. PATENT DOCUMENTS 6,033,968 A * 3/2000 Sung .......................... 438/424
6,323,092 B1 * 11/2001 Lee ............................ 438/296

* cited by examiner

*Primary Examiner*—Richard A. Booth
(74) *Attorney, Agent, or Firm*—Finnegan, Henderson, Farabow, Garrett & Dunner, L.L.P.

(57) ABSTRACT

The present invention provides a device isolation method of a semiconductor memory device and flash memory device fabricating method using the same, which can prevent a bridge occurrence between cells. The present invention includes forming a nitride layer pattern defining a trench forming area on a semiconductor substrate, forming a spacer on a sidewall of the nitride layer pattern, forming a trench in the semiconductor layer by removing a portion of the semiconductor layer using the nitride layer pattern and the spacer as an etch mask, forming a device isolation layer filling up the trench, removing the nitride layer pattern and the spacer to complete the device isolation layer, forming a conductor layer over the substrate including the device isolation layer, planarizing the conductor layer and the device isolation layer to lie in a same plane, and forming an insulating layer over the substrate.

4 Claims, 2 Drawing Sheets

DEVICE ISOLATION METHOD OF SEMICONDUCTOR MEMORY DEVICE AND FLASH MEMORY DEVICE FABRICATING METHOD USING THE SAME

This application claims the benefit of the Korean Application No. P2003-0098359 filed on Dec. 27, 2003, which is hereby incorporated by reference.

BACKGROUND OF THE INVENTION

1. Field of the Invention

The present invention relates to a device isolation method of a semiconductor memory device and flash memory device fabricating method using the same, by which characteristics of the semiconductor memory device can be enhanced.

2. Discussion of the Related Art

Generally, in forming floating gates for fabricating a flash memory device, it is important to electrically separate the floating gates in neighbor cells.

A floating gate is formed in a manner of forming a device isolation layer by shallow trench isolation (hereinafter abbreviated STI), forming a tunnel oxide layer by depositing an oxide layer over a substrate, depositing a doped polysilicon layer on the tunnel oxide layer, and patterning the doped polysilicon layer.

Yet, in the related art floating gate forming method, it is difficult to precisely pattern the floating gate due to the misalignment between the device isolation layer and the etch mask for patterning the floating gate, i.e., the photoresist pattern. Hence, limitation is put on reducing a cell size.

To overcome such a problem, there is a method of forming a tunnel oxide layer and a floating gate after etching an upper part of a device isolation layer having a positive profile.

However, since a lateral side of the floating gate exposed by etching the device isolation has a negative profile, the polysilicon layer is not completely removed in patterning a control gate, whereby a bridge occurs between control gates in neighbor cells.

SUMMARY OF THE INVENTION

Accordingly, the present invention is directed to a device isolation method of a semiconductor memory device and flash memory device fabricating method using the same that substantially obviate one or more problems due to limitations and disadvantages of the related art.

An object of the present invention is to provide a device isolation method of a semiconductor memory device, by which a device isolation layer having a negative profile can be formed.

Another object of the present invention is to provide a flash memory device fabricating method, which can prevent a bridge occurrence between cells due to a residue of a conductor layer generated from anisotropic etch for patterning control and floating gates into cell units and by which device characteristic degradation can be prevented.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a device isolation method of a semiconductor memory device according to the present invention includes the steps of forming a nitride layer pattern defining a trench forming area on a semiconductor substrate, forming a spacer on a sidewall of the nitride layer pattern, forming a trench in the semiconductor layer by removing a portion of the semiconductor layer using the nitride layer pattern and the spacer as an etch mask, forming a device isolation layer filling up the trench, and removing the nitride layer pattern and the spacer to complete the device isolation layer.

Preferably, the spacer is formed of nitride.

Preferably, an upper part of the completed device isolation layer has a negative profile.

In another aspect of the present invention, a method of fabricating a flash memory device includes the steps of forming a nitride layer pattern defining a trench forming area on a semiconductor substrate, forming a spacer on a sidewall of the nitride layer pattern, forming a trench in the semiconductor layer by removing a portion of the semiconductor layer using the nitride layer pattern and the spacer as an etch mask, forming a device isolation layer filling up the trench, removing the nitride layer pattern and the spacer to complete the device isolation layer, forming a conductor layer over the substrate including the device isolation layer, planarizing the conductor layer and the device isolation layer to lie in a same plane, and forming an insulating layer over the substrate.

Preferably, the spacer is formed of nitride.

Preferably, an upper part of the completed device isolation layer has a negative profile.

Preferably, the nitride layer pattern is formed 1,500~4,500 Å thick.

Preferably, the planarizing step is carried out by chemical mechanical polishing.

Preferably, the method further includes the step of removing the completed device isolation layer embedded in the planarized conductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1 to 4 are cross-sectional diagrams for explaining a device isolation method of a semiconductor memory device and flash memory device fabricating method using the same according to the present invention.

Figure 1:
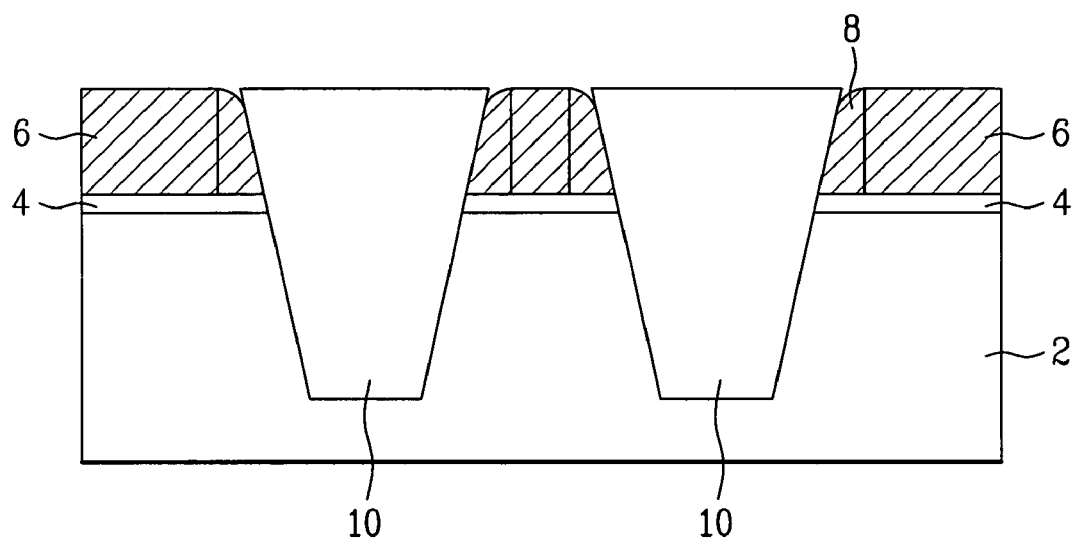
FIGS. 1 to 4 are cross-sectional diagrams for explaining a device isolation method of a semiconductor memory device and flash memory device fabricating method using the same according to the present invention.

Referring to FIG. 1, a pad oxide layer 4 is formed on a semiconductor substrate 2 by growing an oxide layer thereon. And, a nitride layer 6 is deposited on the pad oxide layer 4. In doing so, the nitride layer 6 is formed to be about 1,500~4,500 Å thick.

A photoresist pattern (not shown in the drawing) exposing an area for forming a trench therein is formed on the nitride layer 6.

The nitride layer and the oxide layer are sequentially etched to expose the semiconductor substrate 2 where a trench will be formed using the photoresist pattern as an etch mask.

After removing the photoresist pattern, a second nitride layer is deposited again over the substrate 2.

The second nitride layer is then etched back to form a nitride spacer 8 on a sidewall of the former nitride layer 6.

Subsequently, the exposed semiconductor substrate 2 is anisotropically etched to form a trench using the patterned nitride layer 6 and the nitride spacer 8 as an etch mask.

An oxide layer, e.g., high density plasma oxide layer, having a prescribed thickness is formed over the substrate 2 including the trench by chemical vapor deposition (hereinafter abbreviated CVD) to fill up the trench.

Subsequently, chemical mechanical polishing (hereinafter abbreviated CMP) is carried out on the oxide layer until the patterned nitride layer 6 is exposed, whereby a device isolation layer 10 is formed.

Figure 2:
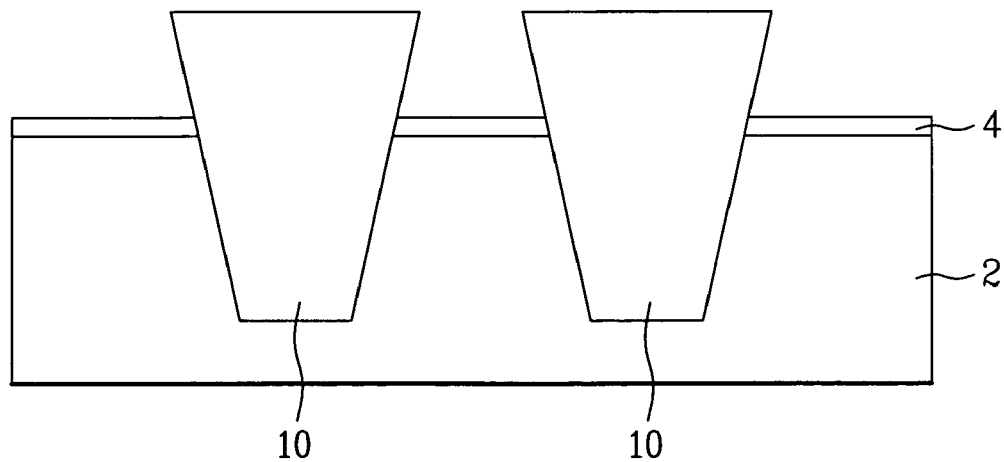

Referring to FIG. 2, both of the patterned nitride layer and the nitride spacer are removed by wet etch using a $H_3PO_4$ solution. Hence, the device isolation layer 10, of which effective device isolation portion has a negative profile, is completed.

Figure 3:
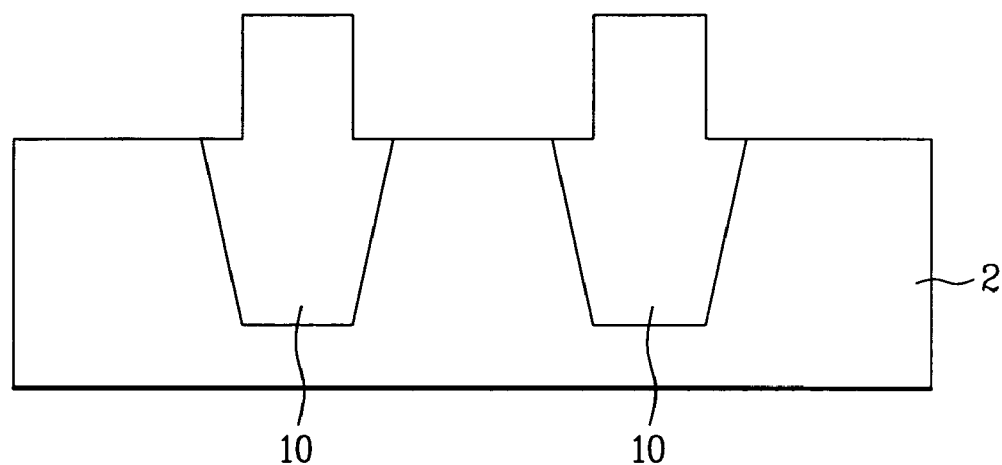

Referring to FIG. 3, the pad oxide layer remaining on the semiconductor substrate 2 is removed. And, cleaning is performed on the semiconductor substrate 2 to form a tunnel oxide later.

Hence, an effective device isolation layer, as shown in the drawing has a vertical profile.

Figure 4:
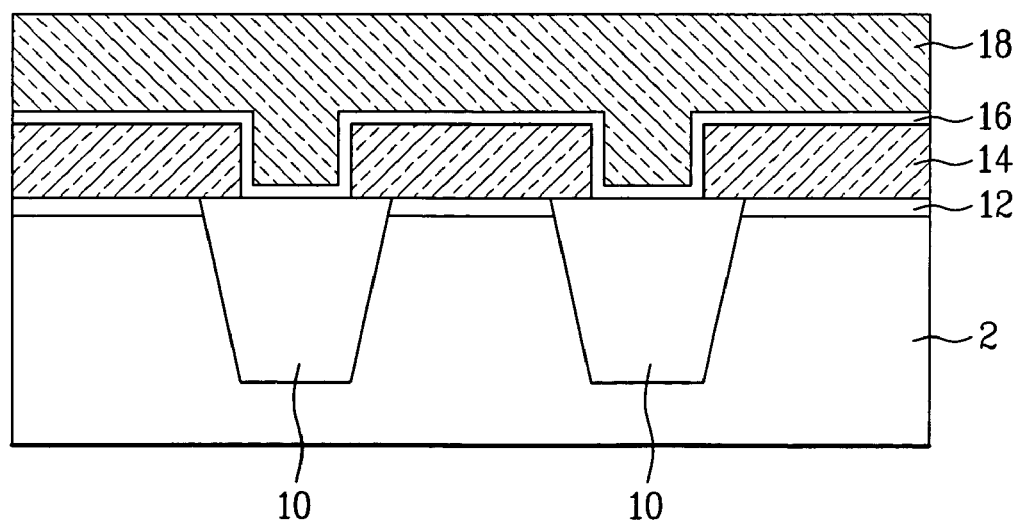

Referring to FIG. 4, a tunnel oxide layer 12 is formed on the semiconductor substrate 2.

A floating gate conductor layer 14 is formed on the tunnel oxide layer 12 by depositing a doped polysilicon layer 14 thereon. Hence, the floating gate conductor layer 14, as shown in the drawing, is formed along topography of the device isolation layer.

Subsequently, CMP is carried out on the floating gate conductor layer 14. In doing so, the CMP is carried out until the device isolation layer 10 is partially removed. Hence, the floating gate conductor layer 14 is separated into a plurality of conductor layer patterns 14 provided to a plurality of cells, respectively. Thus, the floating gate conductor layer 14 can be divided into many patterns separated from each other for a plurality of the cells, respectively.

A portion of the device isolation layer between the floating gate conductor patterns 14 is then removed by wet etch.

An insulating layer 16, e.g., an oxide-nitride-oxide layer is then deposited over the substrate 2 including the floating gate conductor patterns 14.

Thus, once the device isolation layer between the floating gate conductor patterns 14 is removed, it is able to maximize an interface between a floating gate and the insulating layer 16. Hence, a coupling ratio of a cell is increased to raise an operational speed of the device.

Thereafter, a control gate conductor layer 18 is formed on the insulating layer 16 by depositing a doped polysilicon layer thereon.

The control gate conductor layer 18, the insulating layer 16, and the floating gate conductor patterns 14 are anisotropically etched by cell unit. In doing so, since the lateral side of the floating gate conductor patterns 14 has a vertical profile, it is able to prevent a bridge between neighbor cells due to a residue after patterning the conductor layers, whereby electrical characteristic of the device can be enhanced.

Thereafter, the rest of the steps of a general method of fabricating the flash memory device are carried out.

Accordingly, by providing the nitride spacer to the sidewall of the nitride layer pattern for forming the trench, the device isolation layer of which upper part has the negative profile could be formed.

Moreover, using the device isolation layer of which upper part has the negative profile, the flash memory can be fabricated.

Therefore, the present invention can prevent a bridge occurrence between cells due to a residue of a conductor layer generated from anisotropic etch for patterning control and floating gates into cell units as well as device characteristic degradation.

And, the present invention extends the interface between the floating gate and the insulating layer, thereby raising an operation speed of the device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a flash memory device, comprising the steps of:
    forming a nitride layer pattern defining a trench forming area on a semiconductor substrate;
    forming a spacer on a sidewall of the nitride layer pattern;
    forming a trench in the semiconductor substrate by removing a portion of the semiconductor substrate using the nitride layer pattern and the spacer as an etch mask;
    forming a device isolation layer filling up the trench;
    removing the nitride layer pattern and the spacer so that a portion of the device isolation layer above the semiconductor substrate has a negative profile;
    forming a conductor layer over the semiconductor substrate including the device isolation layer;
    planarizing the conductor layer and the device isolation layer to lie in a same plane; and removing the device isolation layer embedded in the planarized conductor layer; forming an insulating layer over the semiconductor substrate.

2. The method of claim 1, wherein the spacer is formed of nitride.

3. The method of claim 1, wherein the nitride layer pattern is formed to be about 1,500~4,500 Å thick.

4. The method of claim 1, wherein the planarizing step is carried out by chemical mechanical polishing.

* * * * *